United States Patent [19]

McGinnis et al.

[11] Patent Number: 5,223,798

[45] Date of Patent: Jun. 29, 1993

[54] METHOD FOR MEASURING THE RESISTIVE TRANSITION AND CRITICAL CURRENT IN SUPERCONDUCTORS USING PULSED CURRENT

[75] Inventors: Wayne C. McGinnis, San Diego; Thomas E. Jones, Spring Valley, both of Calif.

[73] Assignee: The United States of America as represented by the Secretary of the Navy, Washington, D.C.

[21] Appl. No.: 606,396

[22] Filed: Oct. 31, 1990

[51] Int. Cl.$^5$ .................... H01B 12/00; G01N 27/00; G01R 27/26

[52] U.S. Cl. ................................ 324/713; 324/71.6; 505/1; 505/843

[58] Field of Search .............. 324/713, 715, 248, 71.6; 361/19; 505/1, 843, 726

[56] References Cited

U.S. PATENT DOCUMENTS

| | | | |
|---|---|---|---|
| 3,390,330 | 6/1968 | Meyerhoff et al. | 505/843 |
| 3,428,891 | 2/1969 | Purcell et al. | 324/71.6 |
| 3,469,184 | 9/1969 | Lambe et al. | 505/843 |
| 4,777,437 | 10/1988 | Tashiro et al. | 361/19 |
| 4,873,482 | 10/1989 | Gray | 505/843 |
| 4,947,118 | 8/1990 | Fujimaki et al. | 324/248 |

FOREIGN PATENT DOCUMENTS 59169  3/1989  Japan .................. 324/71.6

*Primary Examiner*—Kenneth A. Wieder
*Assistant Examiner*—Maura K. Regan
*Attorney, Agent, or Firm*—Harvey Fendelman; Thomas Glenn Keough; Michael A. Kagan

[57] ABSTRACT

The present invention provides a method for measuring the intragranular and intergranular critical current of a granular superconductive material, comprising the steps of: 1) conducting a substantially rectangular electronic pulse through the material so as to conduct a current through the material such that when the intergranular critical current of the material is exceeded, any grains present in the material remain in a superconducting state when the current level is below the intragranular critical current; 2) measuring the current through the material while conducting the pulse; 3) measuring a voltage difference across the material while conducting the pulse; 4) determining the intergranular critical current through the material by discerning a non-zero voltage difference across the material and contemporaneously measuring the current; and 5) determining the intragranular critical current through the material by varying the current to discern a current level at which the electrical resistance of the material increases to that of the non-superconducting state as the grains of the material transition from the superconducting to a non-superconducting state. This method may also be used to determine the critical current of a homogeneous superconductive material.

18 Claims, 4 Drawing Sheets

METHOD FOR MEASURING THE RESISTIVE TRANSITION AND CRITICAL CURRENT IN SUPERCONDUCTORS USING PULSED CURRENT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of superconductors and more particularly, to a method for measuring the critical current of superconductors.

A superconductor is a material that, below some temperature usually referred to as the critical temperature, $T_c$, loses all electrical resistance to the passage of DC electric current. That is, while superconducting, there is no dissipation of energy; the electrical conduction is lossless. Stated another way, current, once flowing in a loop of such superconducting material, could flow indefinitely without attenuation. A superconductor will only remain superconducting, however, below its critical temperature, below some critical applied magnetic field, and only for electric currents below some critical current. If that critical current is too low, the material cannot be used for most practical applications.

Superconducting materials are useful because their critical currents can be very large over 1,000,000 Amps/cm$^2$. Superconducting wires can be formed into coils to form magnets that can produce magnetic fields many times that of the largest iron electromagnets, and they can do so in a package small enough to be held in the palm of one's hand.

Superconductors have many applications in electronics. Superconducting quantum interference devices (SQUIDs) may be used to make ultra-sensitive magnetometers and gradiometers, digital logic and memory circuits, and radiation detectors covering many parts of the electromagnetic spectrum. Also, superconducting interconnects on microelectronics packages and chips could be used to reduce losses and dispersion for a diverse mix of microelectronic circuits. The actual current needed for these applications is usually in the range of milliamps rather than thousands of amps. However, microelectronics features are being continually reduced in size, and consequently, the required current densities for microelectronics applications are actually comparable to those required for large scale applications such as motors, generators, and energy storage systems. Thus, if superconducting films cannot carry appreciable electric current densities, they will be useless for any real microelectronics circuit. Thus, the ability to measure the critical current of superconductors is a necessary prerequisite to incorporating these materials into practical devices.

In late 1986, high temperature ceramic superconductors were discovered. These materials are very different than previously known superconductors, such as niobium (Nb), niobium-titanium (Nb-Ti), and niobium germanium (Nb$_3$Ge), because they are superconducting at much higher and more easily attained temperatures. Another major difference is that there is more than one measure of the current carrying capacity of the ceramic superconductors—their so-called critical current density, $J_c$. This was not generally the case for the previously known superconducting materials. This fact was not universally appreciated in the scientific community during the 1987–1988 time period. Reports of critical current measurements differed widely around the world, depending on who reported the results, the samples used, and most notably, the measurement techniques employed. Many different techniques have been developed over the years in order to measure the critical current density of superconducting materials. For the conventionally known materials, it really didn't matter a great deal which measurement technique was used because these materials usually had only one critical current density.

The reason the new ceramic superconductors can be characterized by two different critical current densities has to do with their unique morphology, which results from the way they are synthesized. High quality grains of superconductor, carrying large currents, are separated by lower quality material, referred to as weak links, which carry low levels of current. These intergrain regions may consist of materials that are off-stoichiometry, under-oxygenated or which contain impurities and reaction by-products. Transport techniques used to measure $J_c$'s by passing a DC electric current through the sample, are thereby limited by the lower critical current, thus defining a weak-link intergrain current density. Non-transport methods, such as magnetic hysteresis, can be used to infer the intrinsic current in the individual grains (intragrain critical current density). Discrepancies in the reported critical currents of ceramic superconducting materials due to the existence of two characteristic $J_c$'s resulted in much confusion and a lack of progress toward developing practical applications for these materials.

For most applications, the difference between these two measures of the critical current density is an indicator of material defects which limit the performance of the superconductor. Ideally, there should be just one, large critical current for a given material. That is, for a well prepared sample of ceramic superconductor, measurements of the weak-link, intergranular $J_c$ and of the intrinsic, intragranular $J_c$ should yield the same value, indicating that the intergranular regions are not limiting the current-carrying capacity of the sample.

The standard technique for determining the critical current $I_c$ of a superconductor consists of applying a constant or direct current (DC), I, until the voltage difference, V, which appears across the sample exceeds a given value. The current at this point is operationally defined as the critical current. The value of $I_c$ determined from such an experiment can depend on the voltage (or electric field or resistance) criterion chosen. This DC method, although widely used, has the following drawbacks: (1) I$^2$R heating of the sample and contacts (with total resistance R) can give a misleadingly low value for $I_c$, (2) no information is obtained on the rest of the superconducting-to-normal transition, only on the onset of resistance, and (3) special sample mounts (heavy wires, etc.) are needed to carry the large direct currents involved in measurements on bulk samples.

Pulsed current techniques have been used in the past to overcome these problems in measuring the critical current. For the most part, these efforts have used specially designed circuits for producing high-amplitude, multi-step current pulses, or have been limited to single pulses measured from an oscilloscope screen. More recently, in *Phys. Rev.* B 39, 9139 (1989), Goldschmidt describes a quasi-DC "pulse" technique in which current is switched on for about 0.5 seconds, and then turned off for about 5 seconds to allow for heat dissipation. Microscopically, during the period the current is switched on, the normal (non-superconducting) part of the sample and the current contacts to the sample will heat up and warm the superconducting grains, perhaps even driving them normal. The problem is compounded for high currents since the heat generated in the sample increases as $I^2$. One problem that his method does not address is that it does not permit a systematic measurement of the entire transition between the normal (resistive) state and the superconducting (lossless) state, particularly at high currents, or of a determination of the intragranular critical current. Furthermore, the maximum current used by Goldschmidt was 1A. His method would lead to an unacceptable level of sample heating at higher currents.

T. E. Jones and W. C. McGinnis disclosed an abstract of a pulsed current technique to derive the critical temperature of a mixed phase sample of Yb-Ba-Cu-O (D. U. Gubser, M. Schuter, *Materials Research Society Extended Abstracts, High Temperature Superconductors*, Vol. EA-11, "Critical Current Measurements On Yb-Ba-Cu-O", 1987). Pulsed current was used to reduce the effects of sample heating. However, since this method used an AC voltmeter, only the time-averaged value of the sample voltage was measured. The technique presented in that abstract had not been refined to the point where the measurement could be done without noticeably heating the sample. The critical current could not be measured directly, but rather had to be inferred by plotting the suppression of $T_c$ (taken as the resistive transition mid-point) vs. the duty cycle of the current pulses on a graph, where the intercept on the $T_c$ axis (extrapolation to zero duty cycle) was the true $T_c$ of the material, thus accounting for sample heating.

A pulsed transport technique for determining the resistance of a superconductor as a function of temperature is presented in "Critical Current Densities for the High Temperature Ceramic Superconductors $YBa_2Cu_3O_7$ and $Bi_2Sr_2Ca_2Cu_3O_{10+x}$", *IEEE Transactions on Magnetics*, Vol. 25, No. 2, March 1989. The low duty-cycle, pulsed technique was used on specially prepared samples with low resistance current contacts which allowed a determination of the entire superconducting/normal phase boundary without the problems associated with sample heating. However, that method had the shortcoming of having to measure the sample voltage while the temperature was changing. This provided a measurement of the transition temperature of the sample under pulsed conditions, rather than being a direct measurement of the critical current at a fixed temperature.

Thus, there is a need for a simple and repeatable method for directly measuring the intergranular, weak-link critical current and the intrinsic, intragranular critical current of a superconductor.

SUMMARY OF THE INVENTION

Figure 1:
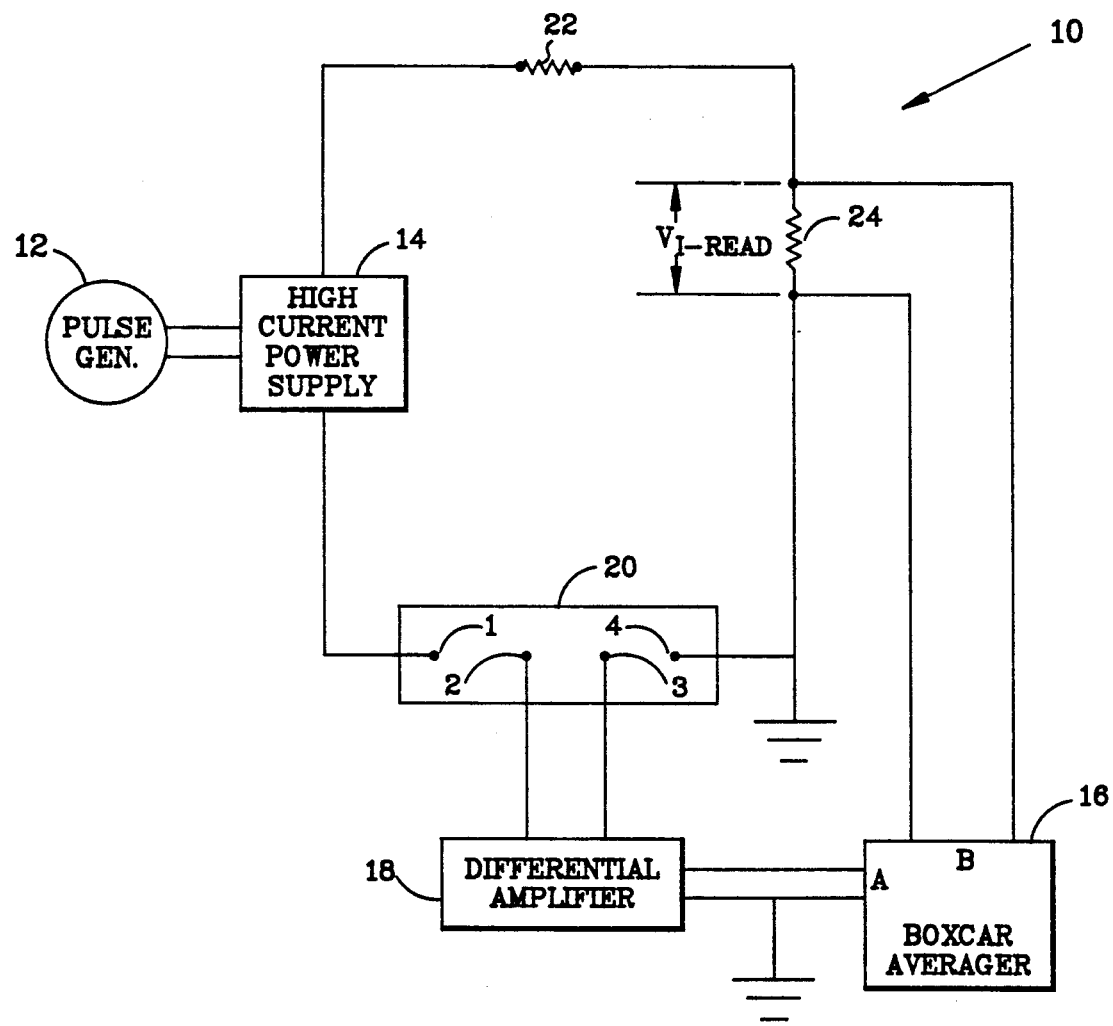
FIG. 1 is a schematic of a pulsed current circuit of the present invention.

The present invention, generally described in *Rev. Sci. Instrum.* 61 (3), pages 984–87, March 1990, overcomes the shortcomings of conventional techniques for determining the critical current of granular superconductors by providing a method for directly measuring both the intergranular, weak-link critical current and the intrinsic, intragranular critical current. The method of the present invention may be used to simultaneously measure the intergranular and intragranular critical currents of a superconductive material, and comprises the steps of: 1) conducting a substantially rectangular electronic pulse through the material so as to conduct a current through the material such that when the intergranular critical current of the material is exceeded, any grains present in the material are in a superconducting state when the current level is below the intragranular critical current; 2) measuring the current through the material while conducting the pulse; 3) measuring a voltage difference across the material while conducting the pulse; 4) determining the intergranular critical current through the superconductor by discerning a non-zero voltage difference across the material and contemporaneously measuring the current; and 5) determining the intragranular critical current through the material by varying the current to discern a current level at which an electrical resistance of the material increases to that of the non-superconducting state as the grains of the material transition from the superconducting to the non-superconducting state. Furthermore, the present invention may be used to make these measurements with current pulses having amplitudes limited only by those provided by available power supplies.

The method of the present invention may also be used to determine the critical current of a homogeneous superconductive material in accordance with the following steps: 1) conducting a substantially rectangular electronic pulse through the material so as to conduct a current through the material; 2) measuring the current through the material while conducting the pulse; 3) measuring a voltage difference across the material while conducting the pulse; and 4) determining the critical current through the superconductor by discerning a non-zero voltage difference across the material and contemporaneously measuring the current.

An important advantage of the present invention is that it can be used to determine the critical current of superconducting films, bulk superconductors, and superconducting wires. Also, the need for special facilities, such as heavy-duty wiring and large volumes of liquid cryogen cooling, required for high current DC measurements, is minimized. Another advantage is that the method of the present invention permits critical currents measured at different facilities to be meaningfully compared. Additionally, in contrast to standard pulse techniques, the present invention provides a continuous output of sample voltage data for monitoring and recording as sample current or temperature are changed.

DESCRIPTION OF THE PREFERRED EMBODIMENT

The pulsed current method of the present invention employs a 4-probe DC measurement of resistance where current is applied in short pulses at a low frequency. A voltage difference, V, is measured across the sample during these short pulses of current, giving a sample resistance $R = V/I$. The heat generated in the sample is reduced, compared to that produced in a DC measurement, by the duty cycle of the applied pulses, where:

*duty cycle* = 100% × (*pulse width*)/(*pulse repetition period*).

This reduction in sample heating is particularly important for very small samples in which the current contacts are in close thermal proximity to the voltage contacts, or for measurements (such as the temperature dependence of $I_c$) in which the sample is not immersed in a liquid cryogen.

An example of one type of circuit 10 by which the method of the present invention may be implemented is described below with reference to FIG. 1. Pulses produced by pulse generator 12, which may be a Tektronix PG505, are amplified by a high-current power supply 14, such as a Kepco BOP36-5M or Kepco ATE25-40M, depending on the current range. Current provided by power supply 14 is conducted through sample contacts 1 and 4 of superconductive sample 20. If power supply 14 is operating in a constant voltage mode rather than a constant current mode ("constant" during the pulses), then current-limiting resistor 22 is included in circuit 10 in series between power supply 14 and sample 20. The resistance of resistor 24, also in series between power supply 14 and sample 20, is selected based on the current level used such that the voltage across resistor 24 is easily measured. Typical values for resistor 24 are 1 ohm for I<5 A and 10 milliohm for larger values of I. The value of resistor 24 may be accurately determined by a DC, 4-probe measurement, a well known technique by those skilled in this art. The power rating of resistors 24 and 22 must be sufficient to handle the pulsed currents used. The voltage outputs of sample 20, available at current contacts 2 and 3, are provided to differential amplifier 18. Boxcar averager 16, as for example, Princeton Applied Research (PAR) 162, has two gated integrators (PAR 166) designated as A and B. The voltage $V_{I\,read}$ is measured across resistor 24 by the boxcar averager at input B during the current pulses, where the current being conducted through sample 20 may be expressed as follows:

$$I = V_{I\,read}/R_{I\,read},$$

where $V_{I\,read}$ is the voltage across resistor 24, and $R_{I\,read}$ is the resistance of resistor 24.

The differentially amplified voltage output of sample 20 from voltage contacts 2 and 3 is received at input A of boxcar averager 16. Boxcar averager 16 improves the signal-to-noise ratio of the sample voltage and current levels measured by averaging the voltage outputs of differential amplifier 18 and $V_{I\,read}$, respectively, over a number of pulses. Differential amplifier 18 may be a PAR 116 preamplifier in a PAR 126 lock-in amplifier.

Figure 2:
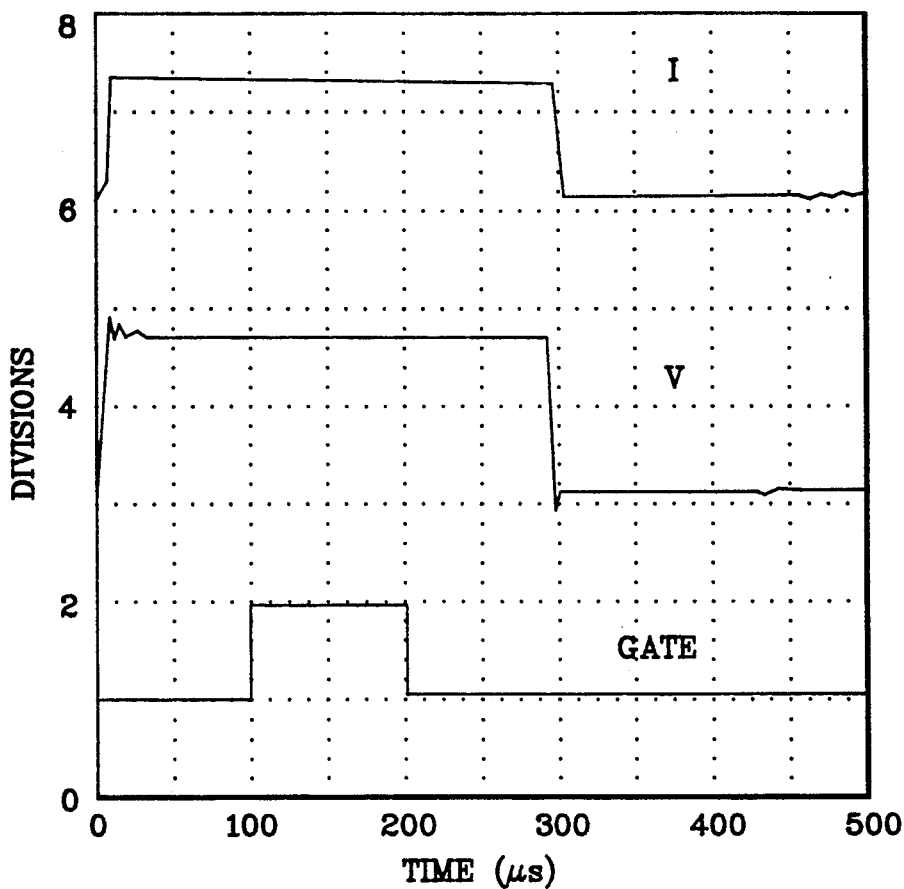
FIG. 2 is a digitized photograph of oscilloscope screen showing current (I: 0.5 A/division), voltage (V: 0.5 mV/division), and gate pulses for a $YBa_2Cu_3O_7$ sample at a temperature of 84.9 K.

The sample current and voltage signals going to boxcar averager 16 may also be monitored on an oscilloscope, not shown. By way of example, typical waveforms for a $YBa_2Cu_3O_7$ sample are shown in FIG. 2. This sample has a transition midpoint of 92 K, and a normal-state (non-superconducting) resistance at 93 K of 15.8 milliohms.

The location of circuit ground has been selected as shown in FIG. 1 both for convenience and to minimize sample voltage noise. Placement of ground between resistor 24 and one of the current contacts of sample 20 allows single-ended input of $V_{I\,read}$ to boxcar averager 16. Proximity of ground to the sample voltage contacts 2 and 3 also helps prevent overloading of the differential amplifier. Note, however, that this choice of ground requires that both the pulse generator and amplifier have a floating output. An isolation transformer, not shown, between pulse generator 12 and power supply 14 could be used to allow one side of the output of pulse generator 12 to be grounded. Another alternative is to differentially measure $V_{I\,read}$ before sending the signal to input B of boxcar averager 16.

It has been found that current pulses with very sharp rise and fall times (<1 microsecond) lead to voltage spikes which overshoot and undershoot, respectively, the expected sample voltages produced by the current pulses through sample 20. These spikes, originating from pulse generator 12, quickly relax back in an underdamped oscillation to the expected voltage levels. The spike amplitude increases as the resistance of sample 20 goes from the normal (non-superconducting) to the zero resistance state (superconducting), which tends to overload differential amplifier 18. The effect is merely an artifact of the circuit parameters, having nothing to do with the superconductivity of sample 20, and occurs even if sample 20 is replaced by a short. The deleterious effects of these voltage spikes are minimized as follows. First, the gate of boxcar 16 is positioned so that the boxcar only "sees" the interior of the pulses, away from the spikes. Second, the rise and fall times of the pulses are increased to about 10 microseconds, which greatly reduces the spike amplitude. Finally, the spike amplitude is also greatly reduced by using twisted-pair current leads to contacts 1 and 4 of sample 20. Standard 50 ohm impedance coaxial cables are used in the room temperature part of the circuit.

The pulsed current techniques of the present invention have been applied to bulk samples of high $T_c$ superconductors such as $YbBa_2Cu_3O_7$, $Bi_2Sr_2CaCu_2O_8$, and $Bi_2Sr_2Ca_2Cu_3O_{10}$. The samples were made in the form of flat disks using standard solid state sintering methods, and mechanically cut down to a small cross section.

These pulsed current measurements can be performed in two different modes. The first mode employs a constant current pulse amplitude, and provides a method for measuring the intragranular critical current of a granular superconductive material, comprising the steps of:

1) conducting one or more substantially rectangular electronic pulses with pulse generator 12 and high current power supply 14 through sample 20 so as to conduct a current through sample 20 such that when the intergranular critical current of sample 20 is exceeded, any grains present in sample 20 are in a superconducting state when the current is less than the intragranular critical current;

2) determining the current through sample 20 by measuring the current through resistor 24 for a predetermined number of pulses (although one pulse may be used) with boxcar averager 16 while conducting the pulses;

3) measuring a voltage difference across sample 20, detected at contacts 2 and 3, with differential amplifier 18 and boxcar averager 16 while conducting the pulses; and 4) determining the intragranular critical current through sample 20 by varying the current with high current power supply 14 to discern a current level at which an electrical resistance of sample 20 increases to that of the non-superconducting state as the grains of sample 20 transition from a superconducting to a non-superconducting state.

Figure 3:
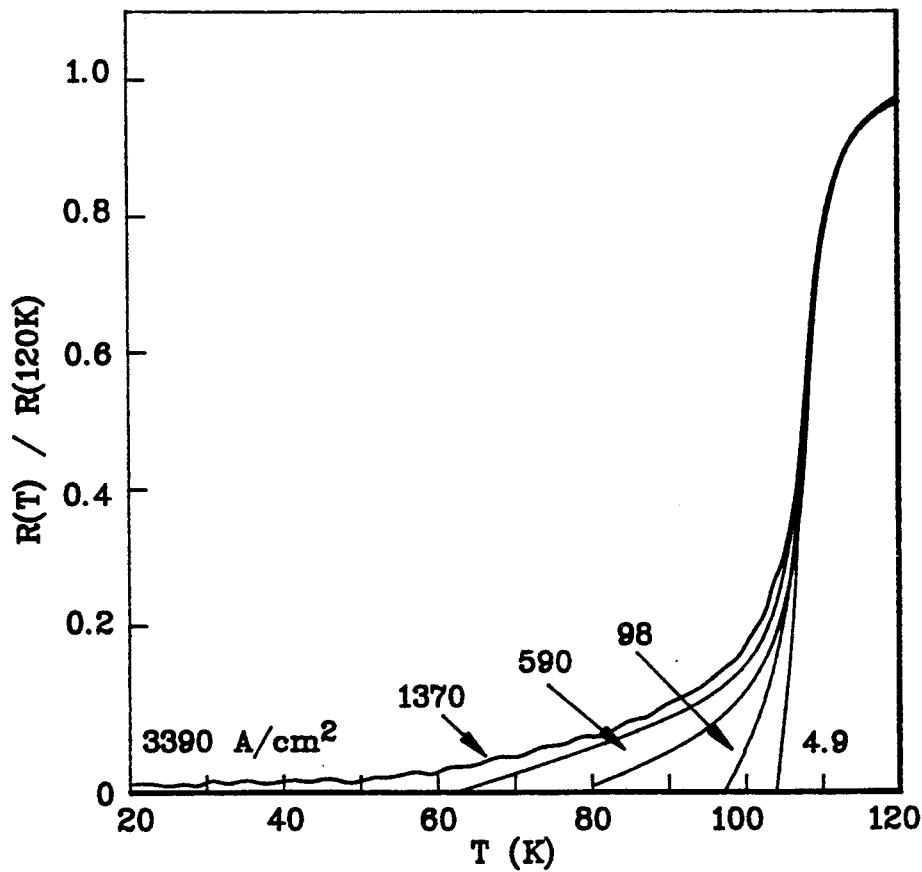
FIG. 3 is a normalized resistance of a $Bi_{1.6}Pb_{0.4}Sr_2Ca_2Cu_3O_{10}$ sample using pulse method at various current densities, where sample resistivity at 120 K is 1.1 mohm-cm.

In this mode, the sample voltage is measured as sample 20 slowly warms. This is effectively a measure of sample resistance R versus temperature T, and is usually used to measure the intragranular critical current, as well as the development of the resistive "tail" that occurs at high current densities. The results for a $Bi_{1.6}Pb_{0.4}Sr_2Ca_2Cu_3O_{10}$ sample measured at various current densities in this way are shown in FIG. 3. The pulse width for these measurements was 100 microseconds and the duty cycle ranged from 0.01 to 0.1%.

The second mode, usually used to study the onset of resistance, provides a method for measuring the intergranular critical current of a granular superconductive material, comprising the steps of:

1) conducting one or more substantially rectangular electronic pulses through sample 20 using pulse generator 12 and high current power supply 14 in order to conduct a current through sample 20 such that when the intergranular critical current of sample 20 is exceeded, any grains present in sample 20 are in a superconducting state;

2) determining the current through sample 20 by measuring the current through resistor 24 while conducting the pulses;

3) measuring a voltage difference across sample 20, detected at contacts 2 and 3, with differential amplifier 18 and box car averager 16 while conducting the pulses; and 4) determining the intergranular critical current through sample 20 material by discerning a non-zero voltage difference across sample 20, detected at contacts 2 and 3, and contemporaneously measuring the current through resistor 24.

Figure 4:
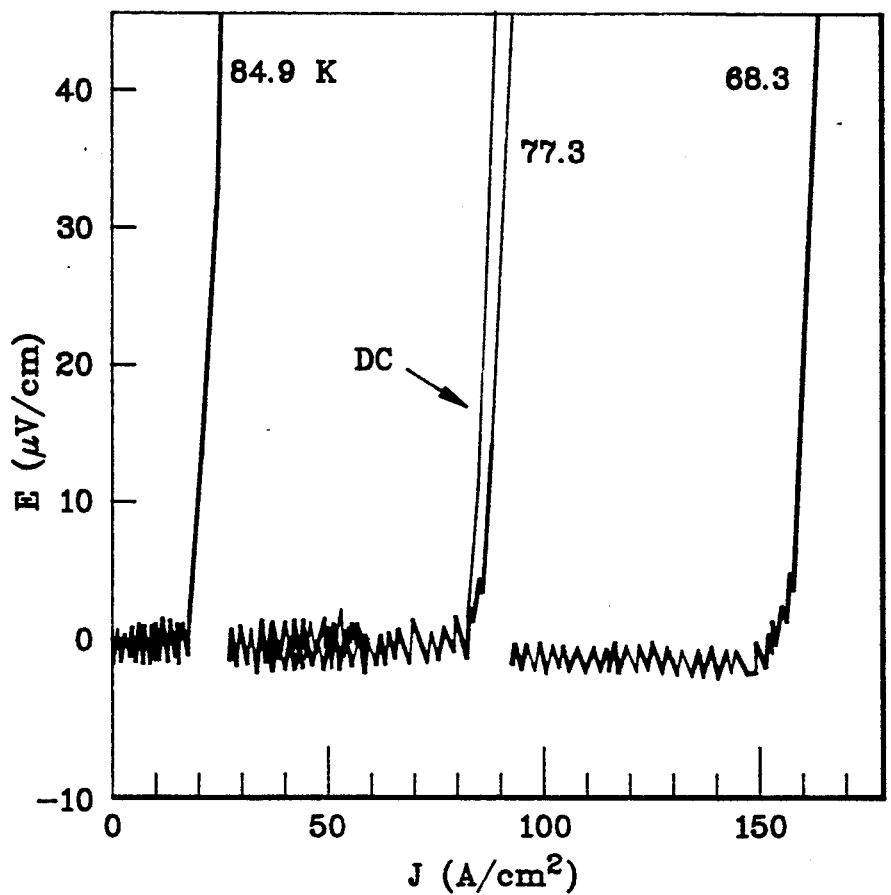
FIG. 4 illustrates current density J versus electric field E at various temperatures for a $YBa_2Cu_3O_7$ sample, where the curve marked DC was measured with direct current, while the others used pulsed current.
Figure 5:
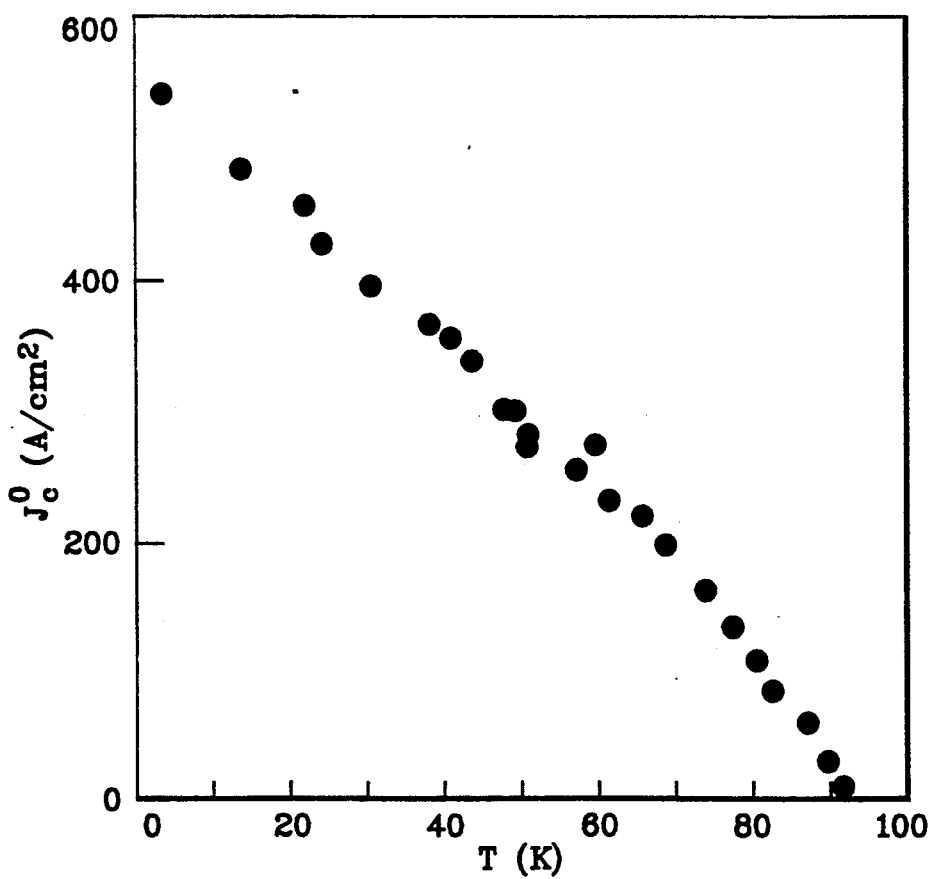
FIG. 5 shows the temperature dependence of the intergranular critical current density $J_c^0$, for a $YBa_2Cu_3O_7$ sample measured with the pulse technique of the present invention.

The second method may be performed at constant temperature, in which the sample voltage is measured as the current pulse amplitude is slowly increased. A series of I-V (actually, current density J versus electric field E) curves at different temperatures is shown in FIG. 4 for the $YBa_2Cu_3O_7$ sample of FIG. 2. The sample cross sectional area is 0.75 mm$^2$, and the voltage probe separation is 2.6 mm. A pulse width of 300 microseconds and duty cycle of 0.4% were used for these measurements. Included in FIG. 4 is a pair of curves measured at the same sample block temperature, one using pulsed current and the other using direct current. Essentially the same critical current is obtained from both techniques. As expected, however, the DC value is slightly less than the pulsed value due to increased local heating of the sample. That is, the sample temperature is slightly higher during the DC measurement than during the pulsed measurement, and so the measured critical current is less (see temperature dependence in FIG. 5).

Furthermore, the method of the present invention may be used for simultaneously measuring the intragranular and intergranular critical current of a granular superconductive material, and includes the following steps:

1) conducting one or more substantially rectangular electronic pulses with pulse generator 12 and high current power supply 14 through sample 20 so as to conduct a current through sample 20 such that when the intergranular critical current of sample 20 is exceeded, any grains present in sample 20 are in a superconducting state when the current level is below the intragranular critical current;

2) determining the current through sample 20 by measuring the current through resistor 24 with box car averager 16 while conducting the pulses;

3) measuring a voltage difference across sample 20, detected at contacts 2 and 3, with differential amplifier 18 and box car averager 16 while conducting the pulses;

4) determining the intergranular critical current through sample 20 by discerning a non-zero voltage difference across sample 20, detected at contacts 2 and 3, with differential amplifier 18 and box car averager 16, and contemporaneously measuring the current through resistor 24; and 5) determining the intragranular critical current through sample 20 by varying the current with high current power supply 14 to discern a current level at which an electrical resistance of sample 20 increases to that of the non-superconducting state as the grains of sample 20 transition from a superconducting to a non-superconducting state.

Figure 6:
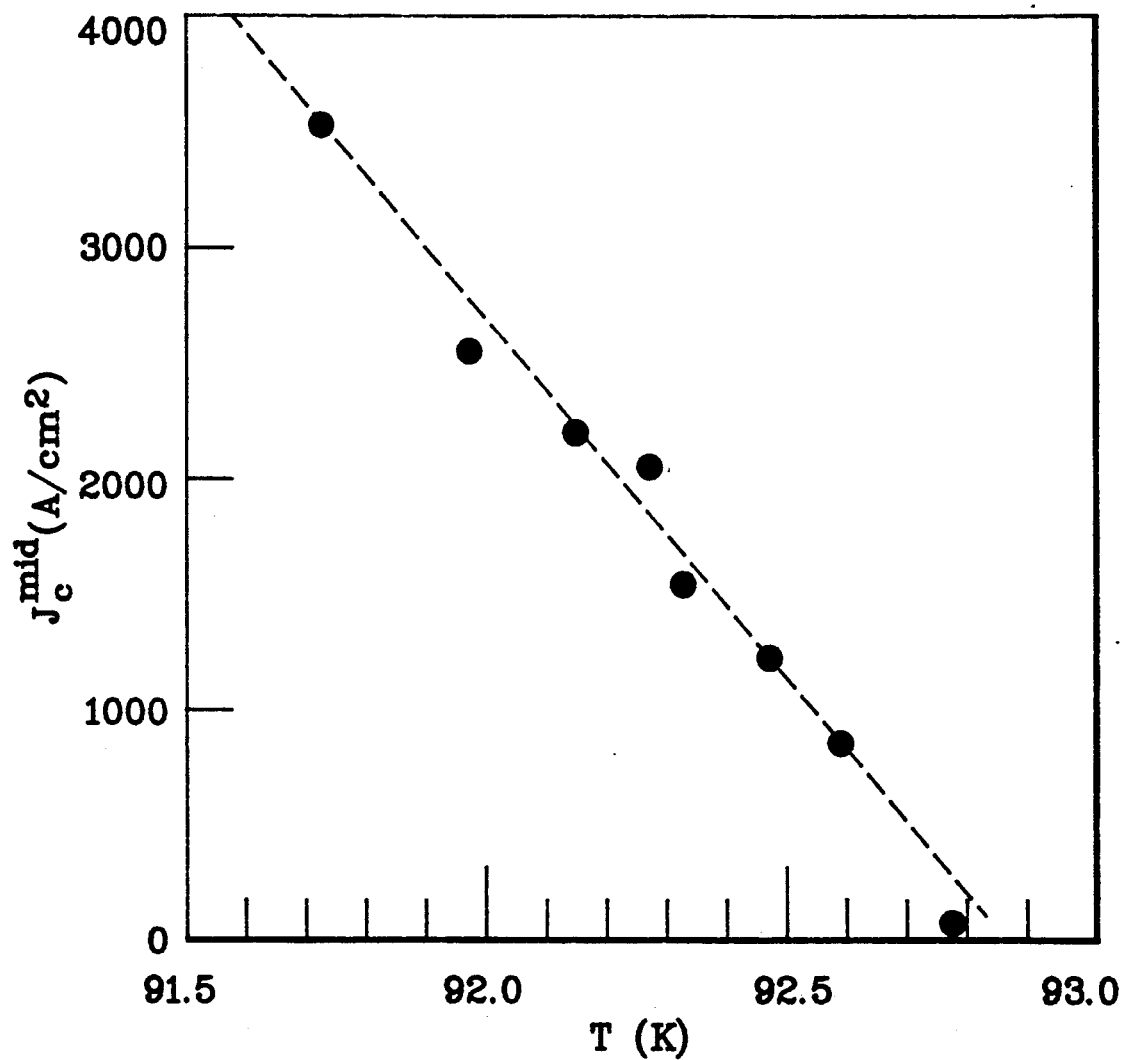
FIG. 6 shows the temperature dependence of the intragranular critical current density, $J_c^{mid}$, near the main superconducting transition for a $YBa_2Cu_3O_7$ sample measured with pulse technique, where an extrapolation of the dashed line least square fit gives an intrinsic critical current density at 77.3 K of $4.9 \times 10^4$ A/cm$^2$.

Two different characteristic critical current densities, intragranular and intergranular, corresponding to the two measurement modes described above, can be associated with the granular form of these high $T_c$ superconducting ceramics. The critical current density normally derived from I-V measurements, $J_c^O$, the intergranular current, is characteristic of the weak links which connect the individual, single-crystal grains of a superconductor. The temperature dependence of $J_c^O$, measured with this pulsed current technique, is plotted in FIG. 5 for another $YBa_2Cu_3O_7$ sample. The much higher intrinsic critical current density of the grains, the intragranular critical current, can also be measured with the same pulse technique. This intragranular current density is obtained by observing the current-induced suppression of the main superconducting transition, such as by measuring changes in the transition midpoint. This current density, denoted $J_c^{mid}$, is plotted in FIG. 6 as a function of the transition midpoint temperature for the sample of FIG. 5. Extrapolation to lower temperatures gives values of intrinsic critical current density which are in very good agreement with results obtained from other techniques, such as magnetic hysteresis methods.

At a high enough pulse duty cycle, or for a resistive enough sample or large enough current-contact resistance, sample heating can be a problem, just as in the DC measurement case. The most direct indication of heating is an increase in the temperature difference dT between the sample and a copper block (not shown) on which the sample is mounted, after accounting for the usual thermal lag between the two as measured by a differential thermocouple. Although a constant dT is the most desirable, an increase of a few degrees is acceptable as long as it is taken into account in determining the sample temperature. Another way to gauge the effects of sample heating is to do a measurement at a given current and duty cycle, and to then compare these results to those obtained when the duty cycle is increased (say by doubling the pulse frequency), but with the same current. The measured result should remain the same if sample heating is insignificant. One or both of these tests can be used to select an appropriate pulse duty cycle when setting up the experiment.

A natural extension of this pulse technique is the measurement of the superconducting properties of high $T_c$ thin films. Very large current densities can easily be produced because of the small cross sections of the films. In addition, critical current and resistance measurements as a function of magnetic field are quite practical for both bulk and film samples with this technique.

While the present invention has been described as being capable of determining the intragranular and intergranular critical currents of a granular superconductive material, the method of the present invention may also be used to determine the critical current of homogeneous superconductive materials such as lead, niobium, tin, aluminum, mercury, and lead-tin alloys. Such a method includes the steps of:

1) conducting one or more substantially rectangular electronic pulses with pulse generator 12 and high current power supply 14 through sample 20, where sample 20 is a homogeneous superconductive material, so as to conduct a current through sample 20;

2) determining the current through sample 20 by measuring the current through resistor 24 while conducting the pulses;

3) measuring a voltage difference across sample 20 at contacts 2 and 3, with differential amplifier 18 and box car averager 16, while conducting the pulses; and 4) determining the critical current through sample 20 by discerning a non-zero voltage difference across sample 20, detected at contacts 2 and 3, and contemporaneously measuring the current through resistor 24 (this current is the same as the current through sample 20).

Obviously, many modifications and variations of the present invention are possible in light of the above teachings. For example, a multifunction board of a digital computer could be used in place of pulse generator 12, high current power supply 14, differential amplifier 18, and box car averager 16, as would be known by those skilled in this field of technology. Another suitable substitution in circuit 10 would be to replace pulse generator 12 with a high-current DC storage battery. Furthermore, resistor 24 could be eliminated by detecting the current of circuit 10 with an inductive pick-up. It is therefore to be understood that within the scope of the appended claims, the invention may be practiced otherwise than as specifically described.

We claim:

1. A method for measuring the intragranular critical current of a granular superconductive material, comprising the steps of:

conducting a substantially rectangular electronic pulse through said material so as to conduct a current through said material such that when said intragranular critical current of said material is exceeded, any grains present in said material are in a superconducting state when said current is less than said intragranular critical current, said material having a critical temperature;

measuring said current through said material while conducting said pulse;

measuring a voltage difference across said material while conducting said pulse; and determining said intragranular critical current through said material by varying said current to discern a current level at which an electrical resistance of said material increases to that of a non-superconducting state as the grains of said material transition from said superconducting to said non-superconducting state.

2. The method of claim 1 wherein:

said step of conducting includes conducting a series of pulses through said material.

3. The method of claim 2 further including the steps of:

repeatedly measuring said voltage difference; and averaging said voltage differences over a predetermined number of pulses.

4. The method of claims 1 or 2 which further includes the steps of:

allowing said current to vary; and maintaining the temperature of said material at a constant temperature below said critical temperature.

5. The method of claim 4 further including the steps of:

repeatedly measuring said voltage difference; and averaging said voltage differences over a predetermined number of pulses.

6. A method for measuring the intragranular and intergranular critical current of a granular superconductive material, comprising the steps of:

conducting a substantially rectangular electronic pulse through said material so as to conduct a current through said material such that when said intergranular critical current of said material is exceeded, any grains present in said material are in a superconducting state when said current level is below said intragranular critical current, said material having a critical temperature;

measuring said current through said material while conducting said pulse;

measuring a voltage difference across said material while conducting said pulse;

determining said intergranular critical current through said material by discerning a non-zero voltage difference across said material and contemporaneously measuring said current; and determining said intragranular critical current through said material by varying said current to discern a current level at which an electrical resistance of said material increases to that of a non-superconducting state as said grains of said material transition from said superconducting to said non-superconducting state.

7. The method of claim 6 wherein:

said step of conducting includes conducting a series of pulses through said material.

8. The method of claim 7 further including the steps of:

repeatedly measuring said voltage difference; and averaging said voltage differences over a predetermined number of pulses.

9. The method of claims 6 or 7 which further includes the steps of:
allowing said current to vary; and
maintaining the temperature of said material at a constant temperature below said critical temperature.

10. The method of claim 9 further including the steps of:
repeatedly measuring said voltage difference; and
averaging said voltage differences over a predetermined number of pulses.

11. A method for measuring the intergranular critical current of a granular superconductive material, comprising the steps of:
conducting a substantially rectangular electronic pulse through said material, having a critical temperature, in order to conduct a current through said material such that when said intergranular critical current of said material is exceeded, any grains present in said material are in a superconducting state; measuring a voltage difference across said material while conducting said pulse;
determining said intergranular critical current through said material by discerning a non-zero voltage difference across said material and contemporaneously measuring said current
allowing said current to vary; and
maintaining the temperature of said material at a constant temperature below said critical temperature.

12. The method of claim 11 which further includes the steps of:
repeatedly measuring said voltage difference; and
averaging said voltage difference over a predetermined number of pulses.

13. A method for measuring the intergranular critical current of a granular superconductive material, comprising the steps of:
conducting a series of substantially rectangular electronic pulses through said material, having a critical temperature, in order to conduct a current through said material such that when said intergranular critical current of said material is exceeded, any grains present in said material are in a superconducting state;
measuring said current through said material while conducting said pulse;
measuring a voltage difference across said material while conducting said pulse;
determining said intergranular critical current through said material by discerning a non-zero voltage difference across said material and contemporaneously measuring said current;
allowing said current to vary; and
maintaining the temperature of said material at a constant temperature below said critical temperature.

14. The method of claim 13 which further includes the steps of:
repeatedly measuring said voltage difference; and
averaging said voltage difference over a predetermined number of pulses.

15. A method for measuring the critical current of a homogeneous superconductive material, comprising the steps of:
conducting a substantially rectangular electronic pulse through said material so as to conduct a current through said material, said material having a critical temperature;
measuring said current through said material while conducting said pulse;
measuring a voltage difference across said material while conducting said pulse;
determining said critical current through said material by discerning a non-zero voltage difference across said material and contemporaneously measuring said current;
allowing said current to vary; and
maintaining the temperature of said material at a constant temperature below said critical temperature.

16. The method of claim 15 further including the steps of:
repeatedly measuring the voltage difference; and
averaging said voltage differences over a predetermined number of pulses.

17. A method for measuring the critical current of a homogeneous superconductive material, comprising the steps of:
conducting a series of substantially rectangular electronic pulses through said material so as to conduct a current through said material, said material having a critical temperature;
measuring said current through said material while conducting said pulse;
measuring a voltage difference across said material while conducting said pulse;
determining said critical current through said material by discerning a non-zero voltage difference across said material and contemporaneously measuring said current;
allowing said current to vary; and
maintaining the temperature of said material at a constant temperature below said critical temperature.

18. The method of claim 17 further including the steps of:
repeatedly measuring said voltage difference; and
averaging said voltage differences over a predetermined number of pulses.

* * * * *